(12) United States Patent
Seng

(10) Patent No.: US 7,691,726 B2
(45) Date of Patent: Apr. 6, 2010

(54) REDUCED FOOTPRINT PACKAGED MICROELECTRONIC COMPONENTS AND METHODS FOR MANUFACTURING SUCH MICROELECTRONIC COMPONENTS

(75) Inventor: Eric Tan Swee Seng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 89 days.

(21) Appl. No.: 11/748,979

(22) Filed: May 15, 2007

(65) Prior Publication Data
US 2008/0067634 A1 Mar. 20, 2008

Related U.S. Application Data

(63) Continuation of application No. 10/818,323, filed on Apr. 5, 2004, now Pat. No. 7,218,001.

(30) Foreign Application Priority Data
Oct. 31, 2003 (SG) .............................. 200306527-3

(51) Int. Cl.
*H01L 21/50* (2006.01)
(52) U.S. Cl. ...................... 438/462; 438/464; 438/113; 438/118; 257/730; 257/E21.499
(58) Field of Classification Search ................ 438/462, 438/464, 113, 118; 257/730, E21.499
See application file for complete search history.

(56) References Cited

U.S. PATENT DOCUMENTS

| | | | |
|---|---|---|---|
| 5,062,565 A | 11/1991 | Wood et al. | |
| 5,107,328 A | 4/1992 | Kinsman | |
| 5,138,434 A | 8/1992 | Wood et al. | |
| 5,593,927 A | 1/1997 | Farnworth et al. | |
| 5,677,566 A | 10/1997 | King et al. | |
| 5,696,033 A | 12/1997 | Kinsman | |
| 5,739,585 A | 4/1998 | Akram et al. | |
| D394,844 S | 6/1998 | Farnworth et al. | |
| D402,638 S | 12/1998 | Farnworth et al. | |
| 5,851,845 A | 12/1998 | Wood et al. | |
| 5,866,953 A | 2/1999 | Akram et al. | |
| 5,891,753 A | 4/1999 | Akram | |
| 5,893,726 A | 4/1999 | Farnworth et al. | |
| 5,898,224 A | 4/1999 | Akram | |
| 5,933,713 A | 8/1999 | Farnworth | |
| 5,938,956 A | 8/1999 | Hembree et al. | |
| 5,958,100 A | 9/1999 | Farnworth et al. | |
| 5,986,209 A | 11/1999 | Tandy | |
| 5,989,941 A | 11/1999 | Wensel | |

(Continued)

*Primary Examiner*—Victor A Mandala
(74) *Attorney, Agent, or Firm*—Perkins Coie LLP

(57) ABSTRACT

The present disclosure describes microfeature workpieces, microelectronic component packages, and methods of forming microelectronic components and microelectronic component packages. In one particular example, a microelectronic component package includes a substrate and a microelectronic component that has a first surface with a surface area greater than that of a second surface. A cementitious material, e.g., a die attach paste, may attach the second surface of the microelectronic component to a mounting surface of the substrate, with the cementitious material extending outwardly beyond a perimeter of the second surface and covering a surface area of the mounting surface that is no greater than the surface area of the first surface. Such a microelectronic component package may be formed with a smaller footprint or, alternatively, may include a microelectronic component having larger dimensions in a microelectronic component package of the same size.

8 Claims, 5 Drawing Sheets

U.S. PATENT DOCUMENTS

| | | | |
|---|---|---|---|
| 5,990,566 A | 11/1999 | Farnworth et al. | |
| 5,994,784 A | 11/1999 | Ahmad | |
| 6,008,070 A | 12/1999 | Farnworth | |
| 6,008,074 A | 12/1999 | Brand | |
| 6,020,629 A | 2/2000 | Farnworth et al. | |
| 6,025,728 A | 2/2000 | Hembree et al. | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,066,514 A | 5/2000 | King et al. | |
| 6,072,236 A | 6/2000 | Akram et al. | |
| 6,075,288 A | 6/2000 | Akram | |
| 6,089,920 A | 7/2000 | Farnworth et al. | |
| 6,097,087 A | 8/2000 | Farnworth et al. | |
| 6,103,547 A | 8/2000 | Corisis et al. | |
| 6,107,122 A | 8/2000 | Wood et al. | |
| 6,107,680 A | 8/2000 | Hodges | |
| 6,117,382 A | 9/2000 | Thummel | |
| 6,124,634 A | 9/2000 | Akram et al. | |
| 6,130,474 A | 10/2000 | Corisis | |
| 6,150,717 A | 11/2000 | Wood et al. | |
| 6,159,764 A | 12/2000 | Kinsman et al. | |
| 6,165,887 A | 12/2000 | Ball | |
| 6,172,419 B1 | 1/2001 | Kinsman | |
| 6,184,465 B1 | 2/2001 | Corisis | |
| 6,198,172 B1 | 3/2001 | King et al. | |
| 6,208,519 B1 | 3/2001 | Jiang et al. | |
| 6,210,992 B1 | 4/2001 | Tandy et al. | |
| 6,215,175 B1 | 4/2001 | Kinsman | |
| 6,228,548 B1 | 5/2001 | King et al. | |
| 6,229,202 B1 | 5/2001 | Corisis | |
| 6,246,108 B1 | 6/2001 | Corisis et al. | |
| 6,247,629 B1 | 6/2001 | Jacobson et al. | |
| 6,252,308 B1 | 6/2001 | Akram et al. | |
| 6,258,624 B1 | 7/2001 | Corisis | |
| 6,259,153 B1 | 7/2001 | Corisis | |
| 6,261,865 B1 | 7/2001 | Akram | |
| 6,277,671 B1 | 8/2001 | Tripard | |
| 6,284,571 B1 | 9/2001 | Corisis et al. | |
| 6,291,894 B1 | 9/2001 | Farnworth et al. | |
| 6,294,839 B1 | 9/2001 | Mess et al. | |
| 6,303,981 B1 | 10/2001 | Moden | |
| 6,303,985 B1 | 10/2001 | Larson et al. | |
| 6,310,288 B1 | 10/2001 | Moden | |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,331,221 B1 | 12/2001 | Cobbley | |
| 6,331,453 B1 | 12/2001 | Bolken et al. | |
| 6,332,766 B1 | 12/2001 | Thummel | |
| 6,365,434 B1 | 4/2002 | Rumsey et al. | |
| 6,432,796 B1 | 8/2002 | Peterson | |
| 6,451,709 B1 | 9/2002 | Hembree | |
| 6,548,757 B1 | 4/2003 | Russell et al. | |
| 6,558,600 B1 | 5/2003 | Williams et al. | |
| 6,561,479 B1 | 5/2003 | Eldridge | |
| 6,564,979 B2 | 5/2003 | Savaria | |
| 6,576,494 B1 | 6/2003 | Farnworth | |
| 6,576,495 B1 | 6/2003 | Jiang et al. | |
| 6,589,820 B1 | 7/2003 | Bolken | |
| 6,614,092 B2 | 9/2003 | Eldridge et al. | |
| 6,622,380 B1 | 9/2003 | Grigg | |
| 6,638,595 B2 | 10/2003 | Rumsey et al. | |
| 6,642,137 B2 * | 11/2003 | Yeh et al. | 438/613 |
| 6,644,949 B2 | 11/2003 | Rumsey et al. | |
| 6,650,013 B2 | 11/2003 | Yin et al. | |
| 6,653,173 B2 | 11/2003 | Bolken | |
| 6,661,104 B2 | 12/2003 | Jiang et al. | |
| 6,670,719 B2 | 12/2003 | Eldridge et al. | |
| 6,672,325 B2 | 1/2004 | Eldridge | |
| 6,673,649 B1 | 1/2004 | Hiatt et al. | |
| 6,680,524 B2 | 1/2004 | Minamio et al. | |
| 6,759,745 B2 | 7/2004 | Masumoto et al. | |
| 6,825,572 B2 | 11/2004 | Tian et al. | |
| 7,218,001 B2 | 5/2007 | Seng et al. | |
| 2002/0096766 A1 * | 7/2002 | Chen et al. | 257/738 |

* cited by examiner

REDUCED FOOTPRINT PACKAGED MICROELECTRONIC COMPONENTS AND METHODS FOR MANUFACTURING SUCH MICROELECTRONIC COMPONENTS

CROSS-REFERENCE TO RELATED APPLICATION

This application is a continuation of U.S. application Ser. No. 10/813,323 filed Apr. 5, 2004, now U.S. Pat. No. 7,218,001 issued May 15, 2007, which claims foreign priority benefits of Singapore Application No. 200306527-3, filed Oct. 31, 2003, both of which are incorporated herein by reference in their entireties.

TECHNICAL FIELD

The present invention generally relates to microelectronic components. Aspects of the invention have particular utility in connection with packaged microelectronic components, e.g., packaged semiconductor dies.

BACKGROUND

FIGS. 1 and 2 schematically illustrate a conventional die package 10. This package 10 includes a semiconductor die 20 that is attached to a front surface 52 of a substrate 50 by a die attach paste 40. The die attach paste 40 is typically applied in a plastic or flowable state and the die 20 is pressed onto the paste, causing excess paste 40 to bleed out from underneath the die 20. A plurality of bonding wires 70 electrically connect contacts 24 carried by the die 20 to bond pads 54 carried by the upper surface 52 of the substrate 50. The bond pads 54 of the substrate 50 are connected to ball bond pads 58 on the back surface 56 of the substrate 50 by vias 60. These ball bond pads 58 may be used, for example, to carry solder balls to electrically connect the package 10 to another microelectronic component. An encapsulant 80 (shown in phantom and FIG. 1) covers the top and sides 28 of the die 20.

Generally, the bond pads 54 of the substrate 50 must be spaced a sufficient distance d to minimize the chance that the die attach paste 40 will bleed out far enough to cover the bond-pad 54. To accommodate the size of the bond pads 54, the periphery 62 of the substrate 50 is spaced at least a minimum distance D from the periphery 28 of the die 20. As suggested in FIG. 1, the lateral dimensions of the encapsulant 80 are typically about the same as those of the substrate 50, such that the periphery 82 of the encapsulant 80 is generally flush with the periphery 62 of the substrate 50. Typical dimensions for the minimum distance D are at least about one millimeter. At least one conventional package 10 achieves a minimum distance D of about 0.8 millimeters by dicing the packages with the saw blade cutting the width of the bond pads 54. Since the periphery 62 is spaced the minimum distance D from each side of the rectangular die 20, such a conventional package 10 is about 1.6 millimeters wider than the die 20 of the package 10.

Market pressures to reduce the size of electronic devices, e.g., mobile telephones and hand-held computing devices, place a premium on the space or "real estate" available for mounting microelectronic components on a printed circuit-board or the like. Similar density pressures also impact manufacturers of computers and other larger-scale electronic devices. An extra 2.5 millimeters per package 10, for example, can significantly add to the dimensions of an array of packaged memory chips, for example.

DETAILED DESCRIPTION

A. Overview

Figure 1:
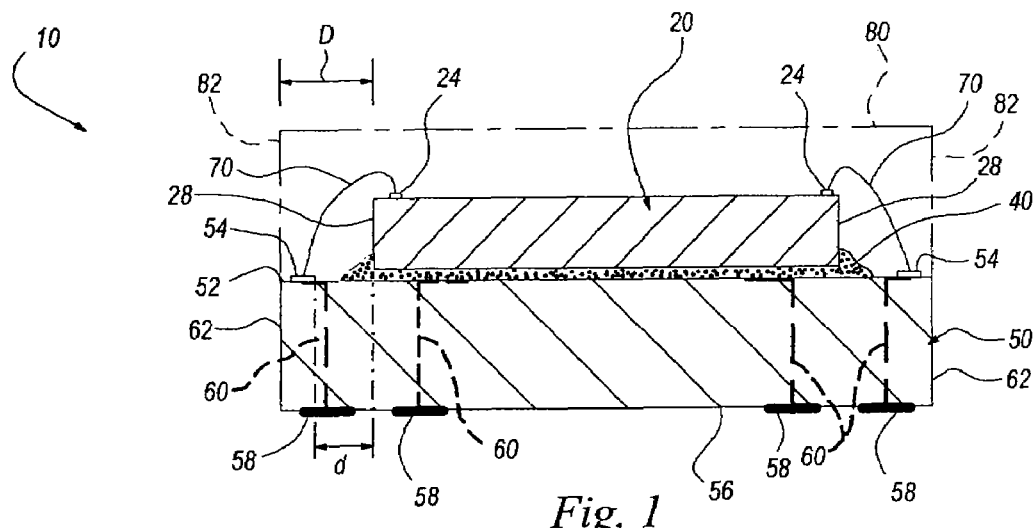
FIG. 1 is a schematic cross-sectional view of a conventional die package taken along line 1-1 of FIG. 2.

Various embodiments of the present invention provide packaged microelectronic components and methods of manufacturing packaged microelectronic components. The terms "microelectronic component" and "microelectronic component assembly" may encompass a variety of articles of manufacture, including one or more memory modules (e.g., SIMM, DIMM, DRAM, flash-memory), ASICs, processors, semiconductor wafers, semiconductor dies singulated from such wafers, or any of a variety of other types of microelectronic devices or components therefor.

A microelectronic component package in accordance with one embodiment of the invention includes a substrate, a microelectronic component, and a cementitious material. The substrate has a mounting surface. The microelectronic component has a first surface and a second surface. The first surface has a surface area greater than a surface area of the second surface. The cementitious material attaches the second surface of the microelectronic component to the mounting surface of the substrate. The cementitious material extends outwardly beyond a perimeter of the second surface of the microelectronic component, but covers a surface area of the mounting surface that is no greater than the surface area of the first surface of the microelectronic component.

Another embodiment of the invention provides a microelectronic component package that also includes a substrate, a microelectronic component, and a cementitious material. The microelectronic component in this embodiment has a first side having a first profile and a second side having a second profile that is smaller than the first profile. A difference between the first profile and the second profile defines a lateral overhang. The cementitious material attaches the second side of the microelectronic component to the substrate. A quantity of the cementitious material extends into, but not laterally beyond, an overhang space between the overhang and the substrate.

A microelectronic component package in accordance with a further embodiment of the invention includes a substrate, a microelectronic component that has a front dimension larger than a back dimension, and a paste between the microelectronic component and the substrate that bonds the microelectronic component to the substrate. The paste has a dimension that is larger than the back dimension, but is smaller than the front dimension.

A microelectronic component package in accordance with still another embodiment of the invention includes a substrate, a semiconductor die, at least one wire, and an encapsulant. The semiconductor die has a first surface, a second surface, and an edge extending between the first surface and the second surface. The first surface has a first surface area and the second surface has a second surface area that is less than the first surface area. The at least one wire electrically couples a component contact carried by the first surface to a contact carried by the substrate. The encapsulant covers the semiconductor die and the at least one wire. The encapsulant has an edge spaced laterally from the edge of the semiconductor die by no more than about 0.5 millimeters.

A microfeature workpiece in accordance with an alternative embodiment of the invention comprises a wafer that has a first surface and a second surface and includes first and second microelectronic components. The first surface carries a first set of contacts associated with the first microelectronic component and a second set of contacts associated with the second microelectronic component. The second surface is spaced from the first surface by a wafer thickness. A gap extends along a first path between the first set of contacts and the second set of contacts. The gap extends inwardly from the first surface a first distance that is less than the wafer thickness, defining a remaining distance between the gap and a plane of the second surface. A channel extends inwardly from the second surface a second distance that is less than or equal to the remaining distance. The channel is wider than the gap and follows a second path that corresponds to the first path. If so desired, the second path may be directly juxtaposed with the first path and/or the channel may be in direct communication with the gap.

One additional embodiment of the invention provides a method of manufacturing a microelectronic component. In accordance with this embodiment, a first kerf is formed in a first surface along a first edge of a microelectronic component. The microelectronic component has a target thickness and the first kerf extends into the target thickness a first distance of between about one mil and about one-half the target thickness. A second kerf is formed in the first surface along a second edge of the microelectronic component. The second kerf extends into the target thickness a second distance of between about one mil and about one-half the target thickness. The first surface of the microelectronic component is attached to a surface of a substrate.

For ease of understanding, the following discussion is broken down into two areas of emphasis. The first section describes aspects of microelectronic components in certain embodiments of the invention. The second section outlines methods of manufacturing microelectronic components in accordance with other embodiments of the invention.

B. Packaged Microelectronic Components

Figure 3:
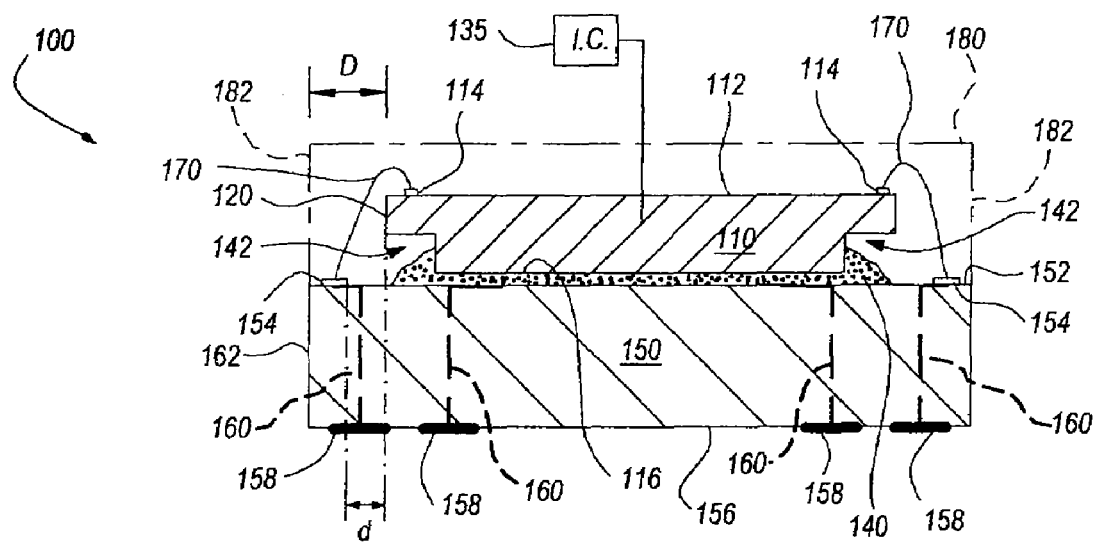
FIG. 3 is a schematic cross-sectional view of a microelectronic component package in accordance with one embodiment of the invention, taken along line 3-3 of FIG. 4.
Figure 4:
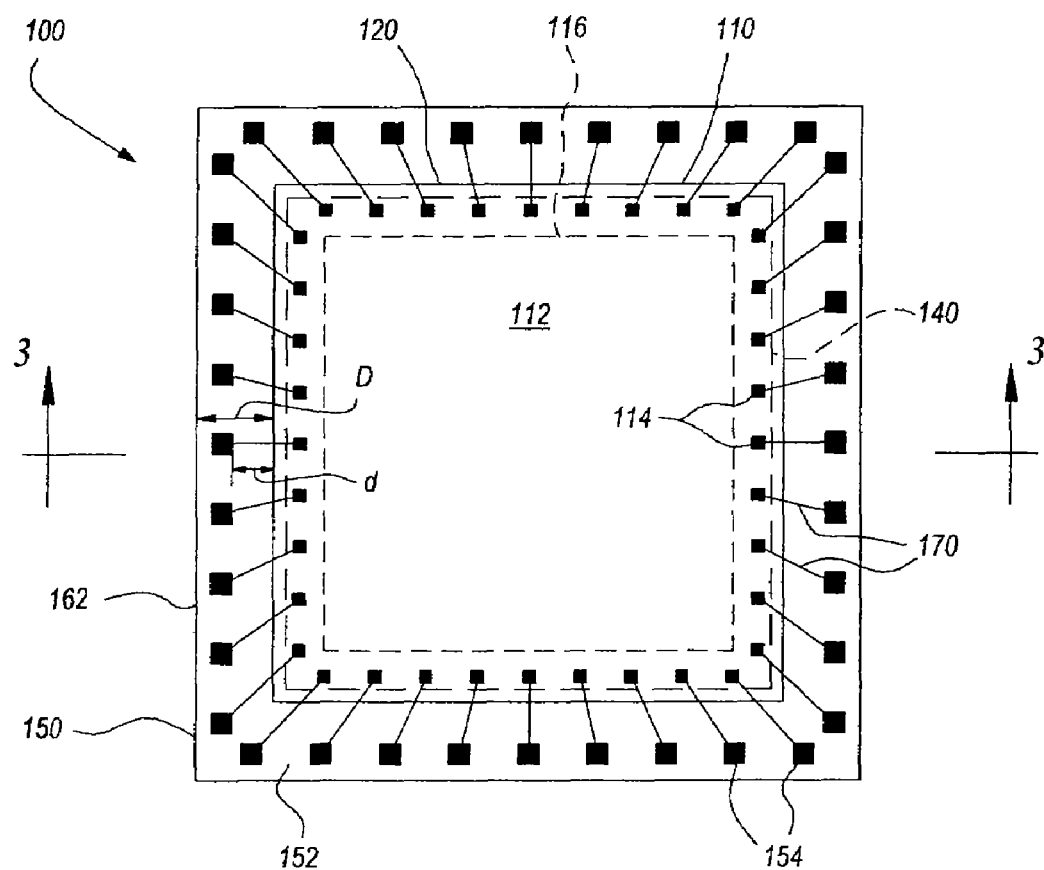
FIG. 4 is a schematic top view of the microelectronic component package of FIG. 3.
Figure 5:
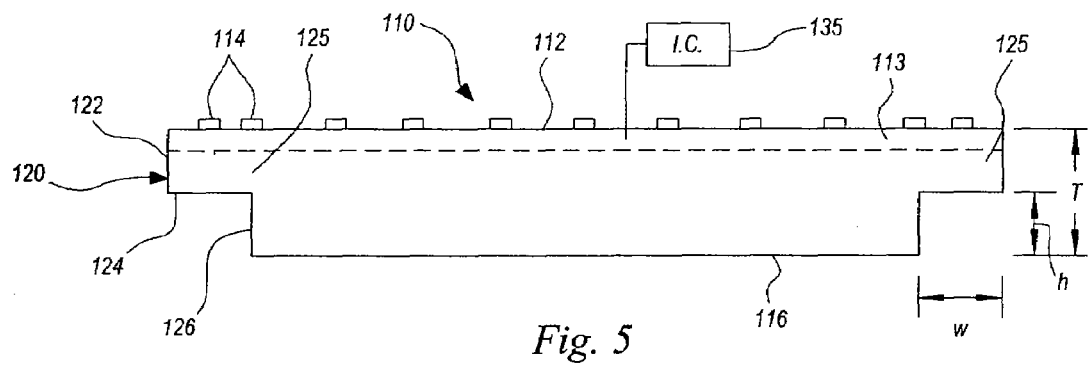
FIG. 5 is an enlarged, schematic side view of the microelectronic component of the microelectronic component package of FIGS. 3 and 4.

FIGS. 3-5 illustrate aspects of a microelectronic component package 100 in accordance with one embodiment of the invention. FIG. 4 is a schematic top view of the microelectronic component package 100. FIG. 3 is a schematic cross-sectional view of the package 100 taken along line 3-3 of FIG. 4 and FIG. 5 is a side view of the microelectronic component 110 shown in FIGS. 3 and 4.

Turning first to FIGS. 3 and 4, the microelectronic component package 100 includes a microelectronic component 110 attached to a mounting surface 152 of a substrate 150 by a cementitious material 140. Aspects of the substrate 150 may be similar to aspects of the substrate 50 illustrated in FIGS. 1 and 2. In particular, the substrate 150 of the microelectronic component package 100 may include a plurality of substrate contacts 154 carried on the mounting surface 152 and a plurality of back contacts 158 carried on a back surface 156. The substrate contacts 154 may be electrically coupled to the back contacts 158 by circuitry 160, e.g., vias through the thickness of the substrate 150.

The substrate 150 may be flexible or rigid and have any desired configuration. In one embodiment, the substrate 150 may be formed of materials commonly used in microelectronic substrates, such as ceramic, silicon, glass, or combinations thereof. Alternatively, the substrate 150 may be formed of an organic material or other material suitable for printed circuit boards (PCBs). In one particular embodiment, the substrate 150 comprises a printed circuitboard such as an FR-4 or FR-5 PCB. If so desired, thermal vias (not shown) may pass through the substrate 150 to assist in cooling the microelectronic component 110 during operation.

As noted above, the term "microelectronic component" is intended to cover a variety of different articles. In many embodiments, the microelectronic component 110 may include an integrated circuit 135 (shown schematically in FIGS. 3 and 5). For example, the microelectronic component 110 may comprise a semiconductor die such as a silicon die carrying the integrated circuitry 135. Although the microelectronic component 110 is illustrated in the drawings as comprising a single element, it should be understood that the microelectronic component 110 can comprise any number of subcomponents. For example, the microelectronic component 110 may comprise two or more stacked semiconductor dies.

The microelectronic component 110 shown in FIGS. 3-5 includes an active surface 112 that carries a plurality of component contacts 114. A back surface 116 of the microelectronic component 110 is spaced from, and may be generally parallel to, the active surface 112. This defines a thickness T (FIG. 5) of the microelectronic component 110. A periphery 120 of the microelectronic component 110 extends between the active surface 112 and the back surface 116.

Figure 2:
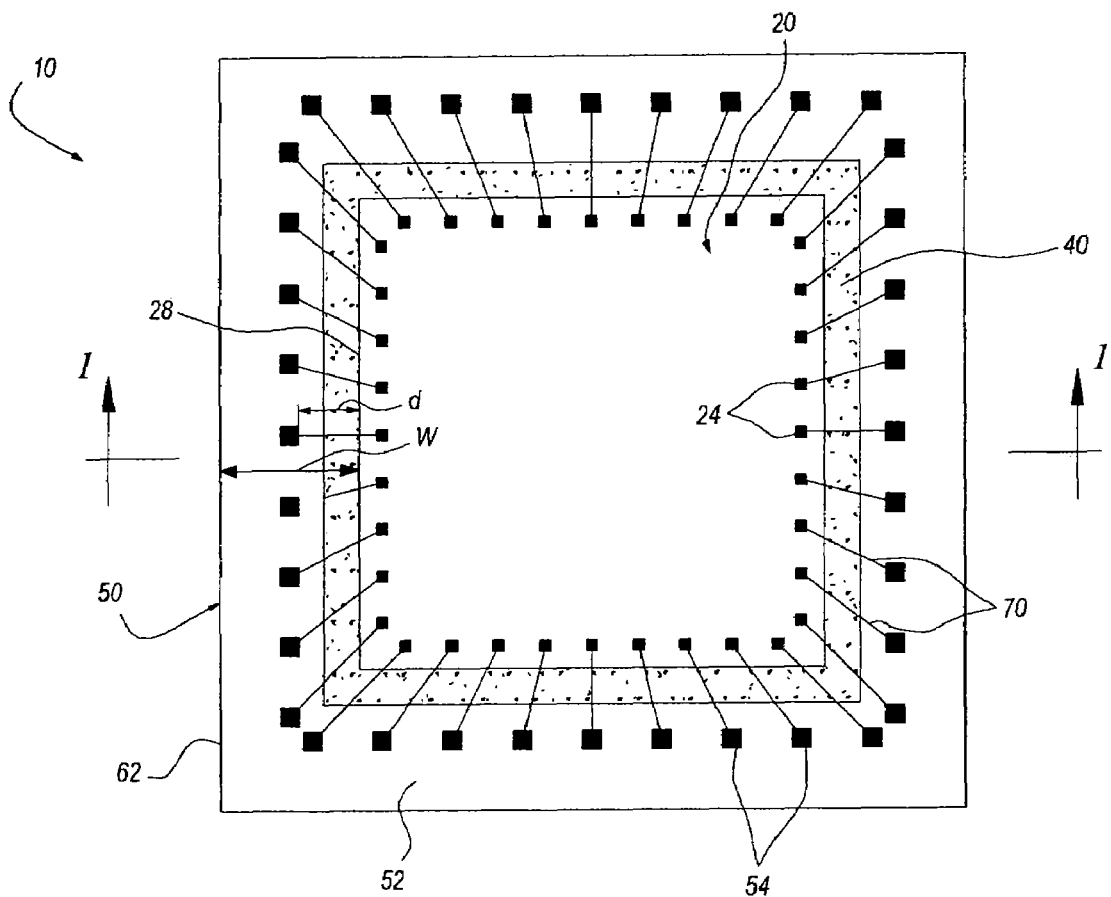
FIG. 2 is a schematic top view of the conventional die package of FIG. 1.

The conventional semiconductor die 20 shown in FIGS. 1 and 2 has a generally flat edge that extends generally perpendicularly from one surface to the other surface of the die 20. In contrast, the microelectronic component 110 of FIGS. 3-5 includes an irregular or stepped periphery 120. As shown in FIG. 5, this stepped periphery includes a first portion 122 that extends rearwardly from the active surface 112, a third portion 126 that extends inwardly from the back surface 116, and an intermediate second portion 124 that extends between the first portion 122 and the third portion 126. In one embodiment of the invention, at least one of the first, second, and third portions 122, 124, and 126 is oriented at an angle with respect to the active surface 112 that differs from the angle at which at least one of the other portions of the periphery 120 is oriented with respect to the active surface 112. The first and second portions 122 and 126 of the microelectronic component 100 shown in FIGS. 3-5 are generally parallel to one another and oriented at an angle that is generally perpendicular to the active surface 112. The second portion 124 may be generally parallel to or oriented at an oblique angle, e.g., an acute angle, with respect to the active surface 112. In the particular embodiment shown in FIG. 5, the second portion 124 is generally parallel to the active surface 112 and meets each of the first and third portions 122 and 126 of the periphery 120 at a right angle. This defines an overhang 125 that extends laterally outwardly beyond a perimeter of the back surface 116 at a location spaced from the back surface 116.

As suggested in FIG. 5, the periphery 120 of the microelectronic component 110 may have a generally L-shaped notch having a width W defined by the width of the second portion 124 and a height h defined by the third portion 126. Suitable dimensions for the width W and the height h may vary depending on the size and type of microelectronic component 110 being used, the nature (e.g., initial rheology) of the cementitious material 140, and the application for which the microelectronic component package 110 is intended. In one embodiment of the invention employing a semiconductor die as the microelectronic component 100, the width W is between about 1 and about 10 mils (about 25-250 microns), with a range of about 2-5 mils (about 50-125 microns) being suitable for many applications. The height h of the L-shaped notch in this embodiment may also range from about 1 mil to about 10 mils (about 25-250 microns). The height h should be sufficient to insure that the active region 113 of the microelectronic component 110, which may carry some or all of the integrated circuit 135, remains intact. In the embodiment shown, the overhang has a thickness that includes both the active region 113 and a thickness of the underlying semiconductor body to help preserve the integrity of the active region 113. In one particular embodiment, the height h of the third portion 126 of the periphery 120 is no more than about one half of the thickness T of the microelectronic component 110. For example, a height h of about 2-5 mils (about 50-125 microns) is expected to suffice for semiconductor dies that are about 8-10 mils (about 200-250 microns) thick.

By virtue of its laterally inwardly extending second portion 124, the periphery 120 of the microelectronic component 110 extends laterally inwardly in a direction from the active surface 112 to the back surface 116 of the microelectronic component 110. As a consequence, the back surface 116 has a surface area that is smaller than the surface area of the active surface 112 of the microelectronic component 110. The profile of the back surface 116 (shown in dashed lines in FIG. 4) is smaller than the profile of the active surface 112. In this illustrated embodiment, a transverse width of the active surface 112 is greater than the corresponding transverse width of the back surface 116. If the overhang 125 (FIG. 5) is about 2-6 mils wide, as noted above, the difference in transverse width of the active and back surfaces 112 and 116 would be about 4-12 mils (about 100-300 microns).

The microelectronic component 110 of FIGS. 3-5 is generally rectangular in shape and has a periphery 120 that extends laterally inwardly along each of its four edges. If so desired, the width W of the overhang 125 (FIG. 5) may be substantially constant, generally centering the back surface 116 with respect to the active surface 112. In other embodiments, the width W of the overhang 125 may vary around the length of the periphery 120. In an alternative embodiment, only a portion of the periphery 120 of the microelectronic component 110 includes an overhang. Some microelectronic components 110, for example, may include one or two rows of component contacts 114 that extend parallel to opposed edges of the microelectronic component 110 rather than extending around the entire periphery of the microelectronic component 110, as shown in FIG. 4. For such a microelectronic component 110, it may suffice to include an overhang 125 on one or each of the opposed edges parallel to the row or rows of contacts 114. The remaining edges of the microelectronic component 110 may be substantially flat between the active surface 112 and the back surface 116. Other configurations suitable for other specific applications will be readily apparent to those of ordinary skill in the art.

As shown in FIG. 3, the microelectronic component 110 is attached to the substrate 150 with the back surface 116 of the microelectronic component 110 juxtaposed with the mounting surface 152 of the substrate 150 and the active surface 112 of the microelectronic component 110 oriented away from the substrate 150. In this orientation, the second portion (124 in FIG. 5) of the microelectronic component periphery 120 is oriented generally parallel to and spaced from the mounting surface 152 of the substrate 150. This defines an overhang space 142 between the overhang 125 of the microelectronic component 110 and the mounting surface 152 of the substrate 150.

As noted above, the microelectronic component 110 is attached to the substrate 150 by a cementitious material 140. In particular, the cementitious material 140 bonds at least the back surface 116 of the microelectronic component 110 to the mounting surface 152 of the substrate 150. As shown in FIG. 3, it may also adhere to the third portion 126 of the component periphery 120. In the embodiment illustrated in FIG. 3, the cementitious material 140 is in direct contact with the back surface 116 of the microelectronic component 110 and the mounting surface 152 of the substrate 150 with no additional intervening layers. In another embodiment, a layer of a soldermask may be disposed between the cementitious material 140 and one or both of the back surface 116 and the mounting surface 152.

It is anticipated that the cementitious material 140 will be flowable or plastically deformable in at least an initial state. In some embodiments, the cementitious material 140 may also be curable into a more rigid state, which may also promote more effective bonding of the microelectronic component 110 to the substrate 150. The cementitious material 140 may be an epoxy, a thermoplastic material, a thermoset material, or any other material having suitable chemical and mechanical properties that will adequately bond the microelectronic component 110 to the substrate 150. In embodiments employing a semiconductor die as the microelectronic component 110, for example, the cementitious material 140 may comprise any one of a variety of commercially available die attach pastes.

In assembling the microelectronic component package 100, a quantity of the cementitious material 140 may be deposited on one or both of the back surface 116 of the microelectronic component 110 and the mounting surface 152 of the substrate 150. The back surface 116 of the microelectronic component 110 may then be juxtaposed with a target area associated with the substrate contacts 154. A distance between the back surface 116 and mounting surface 152 may be reduced by moving one or more of the substrate 150 and the microelectronic component 110. As this distance is reduced, any excess cementitious material 140 may squeeze or "bleed" out to define a bead about at least a portion of the perimeter of the back surface 116. At least some, and preferably at least a majority, of the excess cementitious material 140 is received in the overhang space 142 between the second portion (124 in FIG. 5) of the microelectronic component periphery 120 and the mounting surface 152. In one useful embodiment, the excess cementitious material 140 may extend into, but not laterally beyond, the overhang space 142.

As suggested in FIG. 4, the cementitious material 140 may have a profile that is smaller than the profile of the active surface 112 of the microelectronic component 110 but is larger than the profile of the microelectronic component back surface 116. In one embodiment, the cementitious material 140 extends outwardly beyond the perimeter of the back surface 116, but covers a surface area of the mounting surface 152 of the substrate 150 that is no greater than the surface area of the active surface 112 of the microelectronic component 110.

Comparing FIGS. 1 and 3, highlights certain benefits of embodiments of the present invention. As noted above, the wire bond pads 54 of the conventional package 10 of FIG. 1 must be spaced a distance d that is sufficient to accommodate any bleed out of the die attach paste 40 without compromising the surface of the bond pads 54. As a consequence, the periphery 62 of the substrate (and, in FIG. 1, the periphery 82 of the encapsulant 180) must be spaced a minimum distance D from the die periphery 28 that is typically at least about 0.8 mm, with most packages 10 having a minimum distance of at least about 1 mm. In contrast, the overhang space 142 may accommodate some or all of any cementitious material 140 bleed out, allowing the substrate contacts 154 to be spaced a smaller distance d from the periphery 120 of the microelectronic component 110. This, in turn, permits the use of a smaller substrate 150 having a periphery 162 spaced a smaller minimum distance D that may be less than 1 mm. In one advantageous embodiment, the distance D may be on the order of about 0.5 mm or less.

Compared to a conventional die package 10 having a minimum distance D of about 1 mm from each side of the die 20, employing a distance D of 0.5 mm or less in accordance with embodiments of the invention can reduce the overall lateral dimension of the microelectronic component package 100 by 1 mm or more. Particularly for small hand-held devices, e.g., mobile phones, such a reduction in package size can provide substantial benefit. Alternatively, a larger die may be used in a package 100 that is the same size as the conventional package 10. This may permit more circuitry to be included in the integrated circuit 135, enhancing performance and circuit design options.

At least one of the component contacts 114 may be electrically coupled to one of the substrate contacts 154 by a bonding wire 170, typically after the microelectronic component 110 is attached to the substrate 150 by the cementitious material 140. In the particular embodiment shown in FIGS. 3 and 4, each of the component contacts 114 is coupled to a separate one of the substrate contacts 154 by a separate bonding wire 170.

As suggested by a broken line in FIG. 3, the microelectronic component package 100 may also include an encapsulant 180 that covers the active surface 112 and at least a portion of the periphery 120 of the microelectronic component 110; a portion of the substrate mounting surface 152; and the bonding wire or wires 170. In one embodiment, the encapsulant 180 substantially fills any portion of the overhang space 142 that is not occupied by the bead of cementitious material 140. In the design shown in FIG. 3, the encapsulant 180 is substantially coextensive with the mounting surface 152 of the substrate 150, providing an encapsulant periphery 182 that is substantially flush with the periphery 162 of the substrate 150.

Any of a variety of materials may be used as the encapsulant 180. In one embodiment, the encapsulant 180 may be delivered as a flowable material into a conventional mold and subsequently cured, e.g., by heat treatment, UV exposure or any combination of heating and UV exposure. In one useful implementation, the cementitious material 140 and the encapsulant 180 may both be cured using the same general process, e.g., they may both be UV-curable resins. A wide variety of suitable epoxy resins and other dielectric flowable materials are widely commercially available.

U.S. Patent Application Publication No. US 2003/0107138 A1 (Tian et al., the entirety of which is incorporated herein by reference), which is owned by the assignee of the present invention, discloses a variety of die package designs. In several of those designs, a support is disposed between the die and the surface of a substrate assembly. In at least one of the disclosed designs, the support is smaller than the die. The support is attached to the substrate by a paste, e.g., a flowable die attach paste. The size difference between the support and the die is said to accommodate bleed out of the paste.

Embodiments of the present invention may provide additional advantages not realized in Tian et al., though. Interposing a spacer between the die and the substrate assembly of this reference elevates the die a distance above the substrate assembly. This, in turn, raises the front surface of the die. In the package 100 shown in FIG. 3, the microelectronic component 110, which may comprise a semiconductor die, is separated from the mounting surface 152 of the substrate 150 only by a relatively thin layer of cementitious material 140. As a consequence, the additional height of a separate support is eliminated, allowing a reduced thickness between the active surface 112 of the microelectronic component 110 and the mounting surface 52 of the substrate 150.

In one implementation, this reduced thickness in the package 100 of FIG. 3 permits the outer surface of the encapsulant 180 to be closer to the substrate 150, reducing the thickness and weight of the package 100. Alternatively, if an encapsulant having the same thickness as that employed in Tian et al. is employed in the package 100 of FIG. 3, there will be more clearance between the outer surface of the encapsulant 180 and the loop height of the bonding wires 170. This increased clearance reduces the chance that a portion of the bonding wire may be exposed and subjected to environmental degradation, and may also decrease the risk of undue wire sweep during the encapsulant molding process. In addition, the bonding wires 170 in FIG. 3 may be shorter than those employed by Tian et al. because they traverse a shorter distance between the contacts 114 and 154. Shorter wires 170, in turn, can improve electrical performance and reduce costs.

Figure 6:
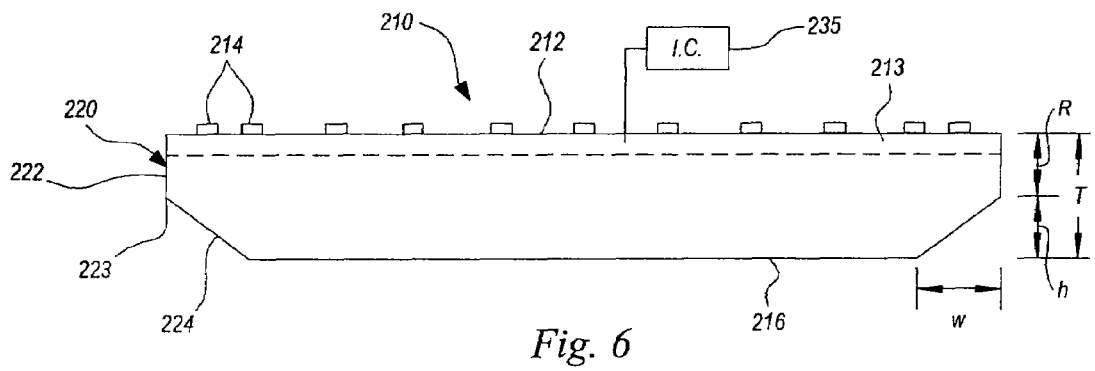
FIG. 6 is a schematic side view of a microelectronic component in accordance with another embodiment of the invention.
Figure 7:
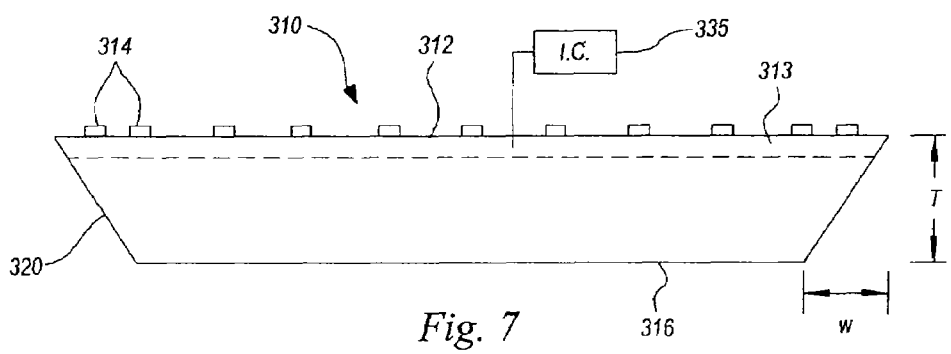
FIG. 7 is a schematic side view of a different embodiment of the invention.
Figure 8:
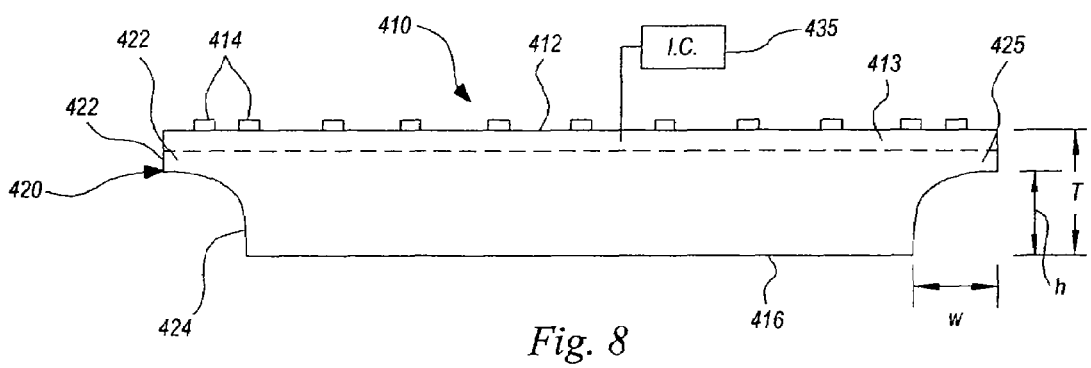
FIG. 8 is a schematic side view of a microelectronic component in accordance with still another embodiment of the invention.

FIGS. 6-8 illustrate various microelectronic components in accordance with other embodiments of the invention. Each of these microelectronic components may be employed in a microelectronic component package in accordance with the invention, e.g., by using the microelectronic component of any one of FIG. 6-8 in place of the microelectronic component 110 in FIGS. 3 and 4.

In FIG. 6, the microelectronic component 210 has an active surface 212 spaced from a back surface 216 by a thickness T. A plurality of component contacts 214 may be carried by the active surface 212 and electrically coupled to an integrated circuit 235 carried at least in part in an active region 213 of the microelectronic component 210. The periphery of the microelectronic component 210 has a first portion 222 oriented at a first angle with respect to the active surface 212 and a second surface 224 oriented at a second, different angle with respect to the active surface 212. In the particular implementation shown in FIG. 6, the first portion 222 may be generally perpendicular to the active surface 212 and the second portion 224 extends laterally inwardly in a direction from the active surface 212 toward the back surface 216. The junction 223 between the first portion 222 and the second portion 224 may be spaced a height h inwardly from the plane of the back surface 216 and spaced a width W laterally outwardly from a perimeter of the back surface 216. The thickness T, height h, and width W measurements may be similar to those outlined above for the microelectronic component 110 (FIG. 5). In FIG. 6, the first portion 222 occupies a remaining portion R of the thickness T of the microelectronic component 210. In one embodiment, this remainder R includes both the active region 213 and a portion of the underlying base. When this microelectronic component 210 is juxtaposed with a substrate 150 (FIGS. 3 and 4) in forming a microelectronic component package similar to the package 100 discussed above, the juxtaposition of the second portion 224 of the component periphery 220 with the mounting surface of the substrate will define an overhang space analogous to the overhang space 142 shown in FIG. 3.

FIG. 7 illustrates a microelectronic component 310 in accordance with another embodiment of the invention. This microelectronic component 310 includes an active surface 312 spaced from a back surface 316 by a thickness T. Component contacts 314 carried by the active surface 312 may be in electrical communication with an integrated circuit 335 carried at least in part in an active region 313 of the microelectronic component 310. In the particular illustrated embodiment, the periphery 320 may be generally flat along each side of the microelectronic component 310, but oriented obliquely to, e.g., at an acute angle with respect to, the active surface 312. The perimeter of the back surface 316 may be spaced laterally inwardly a width W from the perimeter of the active surface 312. In one embodiment, the width W may be similar to, or perhaps less than, those discussed above in connection with the microelectronic component 110 of FIG. 5. This microelectronic component 310 will also define a space between the periphery 320 and the mounting surface of a substrate analogous to the overhang space 142 shown in FIG. 3.

A microelectronic component 410 in accordance with still another embodiment of the invention is shown in FIG. 8. This microelectronic component 410 includes an active surface 412 spaced from a back surface 416 by a thickness T. Component contacts 414 carried by the active surface 412 may be in electrical communication within an integrated circuit 435 carried at least in part in an active region 413 of the microelectronic component 410. The periphery 420 of the microelectronic component 410 includes a first portion 422 and a second portion 424. Unlike the preceding embodiments, the second portion 424 has a generally arcuate shape. A perimeter of the back surface 416 is spaced a width W laterally inwardly from the perimeter of the active surface 412. The second portion 424 of the perimeter 420 meets the first portion 422 at a height h inwardly from the back surface 416, leaving an overhang 425 spaced from the point of the back surface 416. In the particular embodiment shown in FIG. 8, the height h is more than fifty percent of the thickness T, but the overhang 425 still includes the active region 413 and a portion of the underlying base to better insure the integrity of the active region 413. In another embodiment, the height h of the first portion 422 from the back surface 416 may be on the order of no greater than fifty percent of the thickness T.

C. Methods of Manufacturing Microelectronic Components

Figure 9:
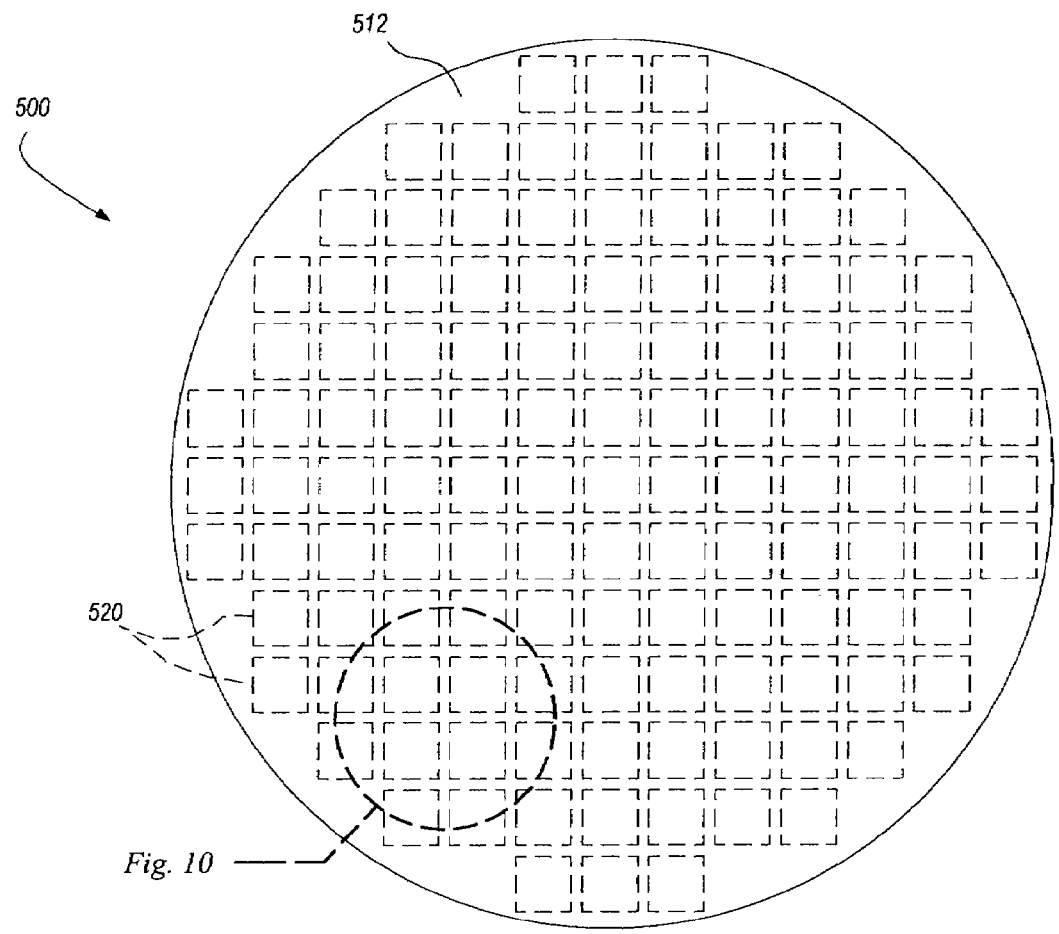
FIG. 9 is a schematic top view of a semiconductor wafer that may be processed in accordance with other embodiments of the invention.
Figure 10:
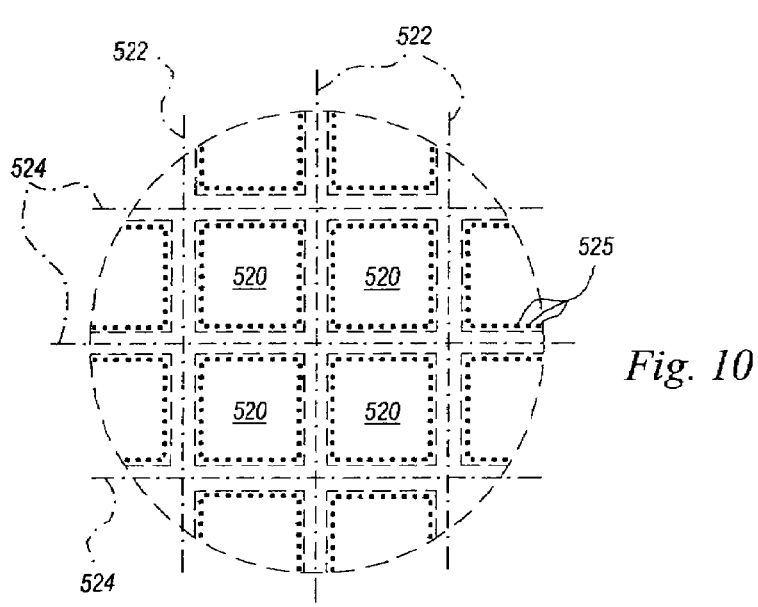
FIG. 10 is an enlarged view of the encircled portion of FIG. 9 designated "FIG. 10."
Figure 11:
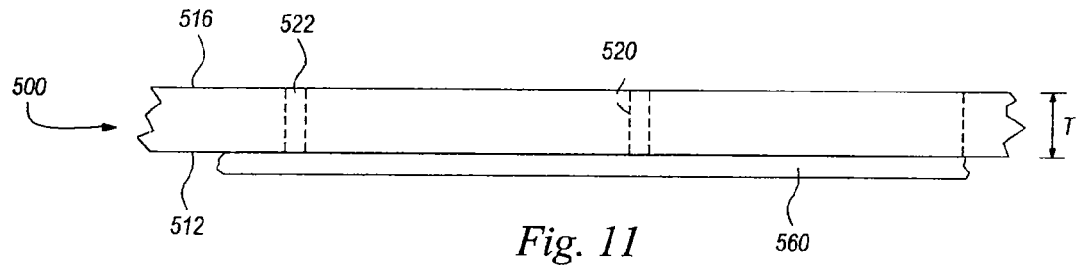
FIGS. 11-14 schematically illustrate sequential stages of processing the semiconductor wafer of FIGS. 9 and 10 in accordance with one particular embodiment of the invention.

FIGS. 9-11 schematically illustrate a microfeature workpiece, typified as a semiconductor wafer 500, that may be processed in accordance with an embodiment of the invention. The wafer 500 has a front surface 512 and a back surface 516 (FIG. 11) spaced from the front surface 512 by a wafer thickness T. As is known in the art, the wafer 500 may include a plurality of microelectronic components 520, e.g., semiconductor dies, typically arranged in a regular array. The aligned spaces between the microelectronic components 520 may define a set of generally parallel first "streets" 522 (FIG. 10) and a set of generally parallel second streets 524 (FIG. 10). The first streets 522 may be oriented at an angle, e.g., 90 degrees, with respect to the second streets 524. As shown in FIG. 10, each of the microelectronic components 520 may include a plurality of contacts 525 carried by the front surface 512 (FIG. 9) of the wafer 500. A set of these contacts 525 may be associated with each of the microelectronic components 520. (The contacts 525 have been omitted from FIGS. 9 and 11-14 to simplify the illustration.)

Figure 12:
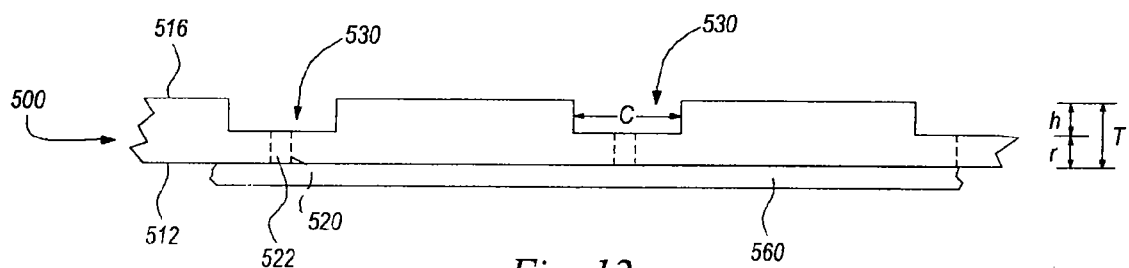

FIGS. 11-14 schematically illustrate stages in the manufacture of a microelectronic component 110 in accordance with one particular embodiment of the invention. In FIG. 11, the wafer 500 is attached to a first temporary support 560, e.g., a polymeric film such as a die attach tape. The terminal-bearing front surface 512 of the wafer 500 is juxtaposed with, and may be adhered directly to, the temporary support 560. The back surface 516 of the wafer 500 is oriented away from the temporary support 560. As shown in FIG. 12, a series of generally parallel channels 530 may extend inwardly from the back surface 516 of the wafer 500 toward the front surface 512. The depth of these channels 530 may be substantially equivalent to the height h of the third segment 126 of the microelectronic component periphery 120 shown in FIG. 5, e.g., about 2-5 mils (about 50-125 microns).

In some circumstances, the wafer 500 may be processed in accordance with embodiments of the invention before the back surface 516 of the wafer 500 is planarized to define a final target thickness of the wafer 500 and, hence, of the microelectronic components 520. In such a circumstance, the depth of the channels 530 may include the desired height h and the additional thickness of the wafer 500 to be removed in the planarizing process. In one exemplary embodiment, the channel 530 may extend a distance of at least about 1 mil (about 25 microns) into the target thickness, i.e., at least about 1 mil beyond the thickness to be removed by planarizing. For example, the channel 530 may extend into the target thickness about 1 mil to about one-half the target thickness.

The channels 530 also have a channel width C that is at least as great as the width W of the second portion 124 of the microelectronic component periphery 120 shown in FIG. 5. In the particular embodiment shown in FIGS. 12-14, this channel width C is greater than twice the target width W.

The channels 530 may follow a path that generally corresponds to the path of the streets 522 between adjacent microelectronic components 520. In the particular illustrated embodiment, a midline of each of the channels 530 may be generally parallel to and follow along a midline of one of the streets 522. In other embodiments, the midlines of the channels 530 may be spaced laterally from the midlines of the associated streets 522. Such an embodiment may be advantageous where an overhang 125 (FIG. 5) is provided only along one edge of the microelectronic component 520, for example.

FIG. 12 illustrates a single pair of parallel channels 530, each of which follows a path that corresponds to one of the generally parallel first streets 522. In embodiments such as that illustrated in FIGS. 3-5 wherein the overhang extends around the entire periphery of the microelectronic component 110, a similar series of parallel channels 530 may follow paths that correspond to the set of second streets 524 (FIG. 10). The resultant second set of parallel channels (not shown in FIG. 12) would intersect at least some of the channels 530 that follow paths correlated to the first streets 522.

The channels 530 may be formed using any of a variety of techniques known for cutting wafers 500. In one particular example, the channels 530 may be formed using a conventional wafer saw, with the dicing blade width of the wafer saw being generally commensurate with the channel width C. Another embodiment of the invention may employ laser ablation or selective etching to form the channels 530.

The temporary support 560 shown in FIGS. 11 and 12 may serve multiple functions. For example, the temporary support 560 may physically support the wafer 500 during the process of cutting the channels 530. The temporary support 560 may also or may instead protect the contact-bearing front surface 512 of the wafer 500 during the process of forming the channels 530. Both of these functions may also be useful in a planarizing step if the channels 530 are formed in the wafer 500 before the wafer 500 has been planarized to the target thickness T. If the functions of the temporary support 560 are deemed unnecessary, the temporary support 560 may be omitted and the channels 530 may be formed without employing the temporary support 560.

Figure 13:
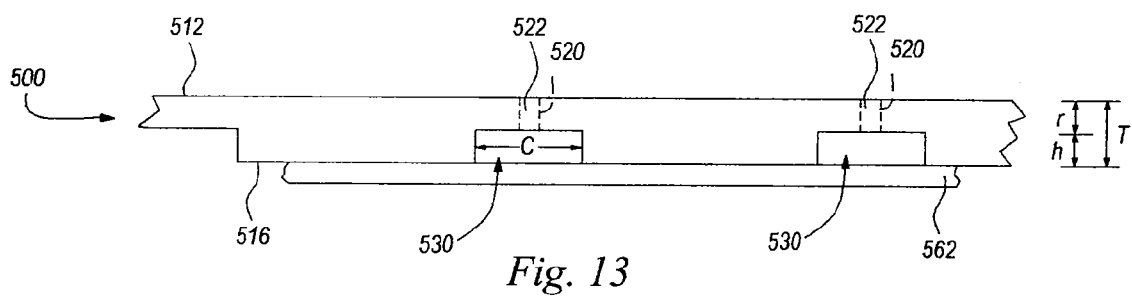

In FIG. 13, the temporary support 560 has been removed from the front surface 512 of the wafer 500. A second temporary support 562 has been attached to the back surface 516 of the wafer 500. Suitable materials for the temporary support 562 may be substantially the same as those mentioned above for the first temporary support 560.

The temporary support 562 may be attached to the generally coplanar portions of the back surface 516 left after forming the channels 530. This will leave a remaining thickness r of the wafer 500 spaced above the temporary support 562.

By cutting through the remaining thickness r of the wafer 500 between the channels 530 and the front surface 512, the wafer 500 may be separated or "singulated" into a series of separate microelectronic components, each of which may be the same as the microelectronic component 110 of FIGS. 3-5. In the embodiment shown in FIG. 14, this is accomplished by forming a series of parallel gaps 540 that extend entirely through the remaining thickness r so the gaps 540 communicate with the associated channels 530. In other embodiments, the gaps 540 may not extend completely through the remaining thickness r, leaving a relatively thin connection (not shown) between adjacent microelectronic components 520. As is known in the art, the wafer 500 may be broken along these thin sections, with the combination of the gaps 540 and channels 530 serving as score lines between adjacent microelectronic components 520.

Figure 14:
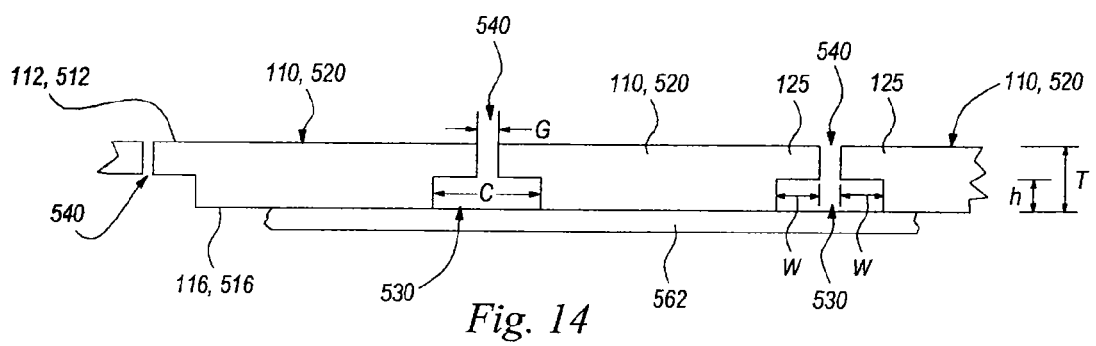

The gaps 540 in FIG. 14 generally follow along the streets 522 in the wafer 500 of FIG. 13. As the embodiment of FIGS. 12 and 13 generally aligns the midlines of the channels 530 with the midline of the associated streets 522, this will generally center the gap 540 with respect to the associated channel 530. In other embodiments, the gap 540 may be displaced laterally from the position shown in FIG. 14, e.g., at one side or the other of the associated channel 530.

The channel width C of the channels 530 may be greater than a gap width G of the associated gaps 540. The relative difference in the dimensions of the channels 530 and the associated gaps 540 will depend at least in part on the desired width W of the overhang 125 in the finished microelectronic component 110. If the microelectronic component 110 includes an overhang 125 on only one of its two opposed sides, the channel width C may be approximately equal to the sum of the desired overhang width W and the gap width G. The gap 540 may then be cut into or through the remaining thickness r (FIG. 13) with a side of the gap 540 generally aligned with a side of the associated channel 530.

In the embodiment shown in FIG. 14, the microelectronic component 110 has an overhang 125 on each of the two opposed sides shown in the drawing. Each of these overhangs 125 may have substantially the same overhang width W. The channel width C in this embodiment may be approximately equal to the gap width G plus two times the overhang width W. By generally aligning the midlines of the gaps 540 with the midlines of the associated channels 530, the remaining thickness r (FIG. 13) may be divided into two overhangs 125, each of which has approximately the same width W.

As noted above, some embodiments of the invention employing semiconductor dies as the microelectronic component 110 may have overhang widths W of about 2-6 mils (about 50-150 microns). In forming such a microelectronic component 110 in accordance with the process outlined in FIGS. 11-14, the channel width C should be about 4-12 mils (about 100-300 microns) greater than the gap width G. In one example, the gaps 540 may be formed using a wafer saw having a blade width of about 1.2-4 mils (about 30-100 microns). To form microelectronic components 110 having a uniform overhang width W of 2-6 mils (50-150 microns), the channel width C would be about 5.2-16 mils (about 130-400 microns). These channels 530 may be formed using a wafer saw with a dicing blade width approximately equal to the channel width C.

FIGS. 11-14 illustrate one possible process for forming microelectronic components, e.g., microelectronic components 110, in accordance with one embodiment of the invention. A variety of other approaches may be used, though. In another embodiment, for example, the first temporary support 560 may remain attached to the front surface 512 of the wafer 500 when forming the gaps 540 and a dicing blade of a wafer saw or other cutting tool may be directed into the channels 530 to cut the gaps 540 from the channel 530 toward the front surface 512. In such an embodiment, the gap 540 may extend through some or all of the remaining thickness r; if the gaps 540 do not extend through the entire remaining thickness r, they may serve as score lines for breaking the wafer 500 in a subsequent step. In still another embodiment, the wafer 500 may be diced by forming the gap 540 through some or substantially all of the thickness T of the wafer 500. The channels 530 may then be formed by cutting inwardly from the back surface 516 of the wafer 500, effectively widening a portion of the gap 540 to form a kerf on one or both of the adjacent edges of the microelectronic components 110. In one alternative embodiment, the overhangs 125 may be formed on already singulated microelectronic components 110 by cutting one kerf along one edge of the microelectronic component 110 and cutting another kerf along the opposite edge of the microelectronic component 110.

The above-detailed embodiments and examples are intended to be illustrative, not exhaustive, and those skilled in the art will recognize that various equivalent modifications are possible within the scope of the invention. For example, whereas steps are presented in a given order, alternative embodiments may perform steps in a different order. The various embodiments described herein can be combined to provide further embodiments.

In general, the terms used in the following claims should not be construed to limit the invention to the specific embodiments disclosed in the specification unless the preceding description explicitly defines such terms. The inventors reserve the right to add additional claims after filing the application to pursue additional claim forms for other aspects of the invention.

I claim:

1. A method of manufacturing a microelectronic component, comprising:

forming a first kerf in a first surface along a first edge of a microelectronic component, the microelectronic component having a target thickness and the first kerf extending into the target thickness a first distance of between about 1 mil and about one half the target thickness;

forming a second kerf in a second surface opposite the first surface along a second edge of the microelectronic component, the second kerf extending into the target thickness a second distance of between about 1 mil and about one half the target thickness, wherein a thin connection portion remains between the first and second kerfs, and wherein the first surface has a first surface area that is less than a second surface area of the second surface;

attaching the first surface of the microelectronic component to a surface of a substrate with a flowable cementitious material; and pressing the first surface towards the substrate surface while keeping the cementitious material within a third surface area of the substrate that is greater than the first surface area and less than the second surface area.

2. The method of claim 1 further comprising electrically coupling the microelectronic component to the substrate.

3. The method of claim 1 wherein the first kerf extends laterally inwardly from the first edge by at least about 2 mils.

4. The method of claim 1 wherein the first kerf extends laterally inwardly from the first edge by about 2-6 mils.

5. The method of claim 1 wherein the first kerf extends laterally inwardly from the first edge by at least about 2 mils and the second kerf extends laterally inwardly from the second edge by at least about 2 mils.

6. The method of claim 1 wherein the microelectronic component comprises a semiconductor die included in a wafer that includes a plurality of additional semiconductor dies, a difference between the first distance and a thickness of the wafer defining a remaining thickness, the method further comprising severing the remaining thickness to separate the microelectronic component from one of the additional semiconductor dies.

7. A method of manufacturing a microelectronic component, comprising:

forming a first kerf in a first surface along a first edge of a microelectronic component, wherein the first kerf extends a first depth into the microelectronic component from the first surface and a first distance laterally inwardly from the first edge;

forming a second kerf in a second surface opposite the first surface along a second edge of the microelectronic component, wherein the second kerf extends a second depth into the microelectronic component from the second surface and a second distance laterally inwardly from the second edge, and wherein the second depth is less than or equal to the first depth, the second distance is less than the first distance, and the first surface has a first surface area that is less than a second surface area of the second surface;

disposing a flowable cementitious material between the first surface of the microelectronic component and a mounting surface of a substrate; and pressing the first surface towards the mounting surface to cover a third surface area of the mounting surface with the cementitious material, wherein the third surface area is greater than the first surface area and less than the second surface area.

8. A method of manufacturing a microelectronic component, comprising:

forming a gap in a first surface along a first edge of a microelectronic component, the gap extending into the microelectronic component a first depth and a first width;

forming a channel in a second surface opposite the first surface along a second edge of the microelectronic component, the channel extending into the microelectronic component a second depth and a second width, wherein the second depth is less than or equal to the first depth and the second width is less than the first width such that the first surface has a first surface area that is greater than a second surface area of the second surface; and attaching the first surface of the microelectronic component to a mounting surface of a substrate with a flowable cementitious material that covers a third surface area of the mounting site, wherein the third surface area is greater than the second surface area and less than the first surface area.

* * * * *